(12) United States Patent
Goto

(10) Patent No.: US 9,564,196 B2
(45) Date of Patent: Feb. 7, 2017

(54) SEMICONDUCTOR MEMORY DEVICE AND DATA WRITING METHOD USING A CHECKERBOARD PATTERN UTILIZING EXISTING DATA SUPPLY BIT ADDRESSES

(71) Applicant: Seiko Instruments Inc., Chiba-shi, Chiba (JP)

(72) Inventor: Tomotsugu Goto, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 0 days.

(21) Appl. No.: 15/003,317

(22) Filed: Jan. 21, 2016

(65) Prior Publication Data

US 2016/0225416 A1    Aug. 4, 2016

(30) Foreign Application Priority Data

Jan. 29, 2015    (JP) ................... 2015-015374

(51) Int. Cl.

| G11C 11/34 | (2006.01) |
|---|---|
| G11C 8/18 | (2006.01) |
| G11C 16/34 | (2006.01) |
| G11C 29/10 | (2006.01) |
| G11C 29/20 | (2006.01) |
| G11C 29/36 | (2006.01) |
| G11C 8/10 | (2006.01) |
| G11C 16/08 | (2006.01) |
| G11C 29/18 | (2006.01) |

(52) U.S. Cl.
CPC ............ *G11C 8/18* (2013.01); *G11C 16/3427* (2013.01); *G11C 29/10* (2013.01); *G11C 29/20* (2013.01); *G11C 29/36* (2013.01); *G11C 8/10* (2013.01); *G11C 16/08* (2013.01); *G11C 2029/1802* (2013.01)

(58) Field of Classification Search
USPC .................. 365/185.05, 185.11, 185.17, 185.18, 365/185.21, 185.29, 185.33
See application file for complete search history.

(56) References Cited

U.S. PATENT DOCUMENTS

| 4,744,058 A | 5/1988 | Kawashima et al. | |
|---|---|---|---|
| 6,055,189 A * | 4/2000 | Ogane | G11C 16/3454 365/185.11 |
| 6,643,175 B2 * | 11/2003 | Yamauchi | G11C 16/3454 365/185.11 |

(Continued)

FOREIGN PATENT DOCUMENTS

JP    2001-236795 A    8/2001

*Primary Examiner* — Trong Phan
(74) *Attorney, Agent, or Firm* — Brinks Gilson & Lione

(57) ABSTRACT

To provide a semiconductor memory device capable of writing a checkerboard pattern for interference and investigation by three writings regardless of the magnitude of memory capacity by making a change of a simple circuit configuration free from the need of a data holding circuit and a voltage converting circuit large in circuit area in a memory array in which the order of arrangement of bits is reversedly arranged between data words adjacent in a row direction. A row decoder and a column decoder are respectively configured to enable operation switching to an all selection mode and an even/odd-based selection mode in addition to a single address selection mode of a memory array by a control signal from a control circuit.

2 Claims, 4 Drawing Sheets

(56) References Cited

U.S. PATENT DOCUMENTS

| 7,239,548 B2* | 7/2007 | Kato | G11C 5/14 |
| | | | 365/185.11 |
| 9,042,182 B2* | 5/2015 | Sakakibara | G11C 16/3459 |
| | | | 365/185.21 |

* cited by examiner

SEMICONDUCTOR MEMORY DEVICE AND DATA WRITING METHOD USING A CHECKERBOARD PATTERN UTILIZING EXISTING DATA SUPPLY BIT ADDRESSES

RELATED APPLICATIONS

This application claims priority under 35 U.S.C. §119 to Japanese Patent Application No. 2015-015374 filed on Jan. 29, 2015, the entire content of which is hereby incorporated by reference.

BACKGROUND OF THE INVENTION

Field of the Invention

The present invention relates to a semiconductor memory device, and more specifically to a matrix selection mechanism of a memory array.

Background Art

FIG. 4 is a circuit diagram illustrating a memory array of a related art EEPROM. One address is comprised of a memory word composed of a plurality of bits. A memory cell is comprised of a floating gate 401 for holding data and a control gate 402 for selecting a bit, and holds information of one bit therein. Since the reading of data from a memory normally starts from the MSB, i.e., the most significant bit side of data, MSB data is stored in a memory cell close to a word selector from the MSB side needed to be read earliest. The LSB of a data word, i.e., the least significant bit of data is stored in the farthest memory cell. In the process of manufacturing a memory array using an EEPROM, a checkerboard pattern in which data bits to be stored of memory cells adjacent to each other are brought into an inverted state, is required to be written in order to examine that data interference does not occur between adjacent memory cells.

As a method of writing a checkerboard pattern, there are a method of executing writing for each word, and a method of providing an even/odd-based selection function in each of row decoders of a memory array as proposed in a related art and writing bit-inverted data therein respectively.

[Patent Document 1]
Japanese Patent Publication No. Hei 4 (1992)-66080
[Patent Document 2]
Japanese Patent Application Laid-Open No. 2001-236795

SUMMARY OF THE INVENTION

In the method of executing writing for each word, however, a test time also increases in proportion to memory capacity.

Further, in a recent memory array, as illustrated in FIG. 2, memory words adjacent in a row direction are arranged to be inverted with a column direction as an axis, and memory words adjacent in the column direction are arranged to be inverted with the row direction as an axis. The advantage of the present arrangements resides in that since a source line connected to each memory word can be shared between adjacent memory words, the area necessary to wire each source line in the memory array can be reduced to one half. The advantage is a technique indispensable even for reducing a chip area.

Since the memory words adjacent in the row direction are arranged in such a manner that the LSBs or MSBs are closest to each other in the memory array having adopted the present arrangements, it is not possible to write a checkerboard pattern only by the even/odd-based selection of each row decoder such as in the related art.

As a means for solving the above, there is generally provided a configuration that as illustrated in FIG. 3, a data supply means is provided which performs the holding of data and the conversion of a writing voltage respectively for each memory cell corresponding to all words which configure one row in a memory array.

This has the disadvantage that since a data holding circuit and a voltage converting circuit are additionally increased, and the amount of buses connecting these is also increased, a chip area increases and control also becomes complicated.

The present invention has been made with the foregoing in view, and provides a semiconductor memory device capable of writing a checkerboard pattern without increasing a data supply means even in a memory array in which adjacent memories are reversedly disposed in word units for sharing of source lines, and additionally without allowing the time taken for writing to be proportional to memory capacity.

In order to solve the above problems, a semiconductor memory device of the present invention is configured by the following elements.

The semiconductor memory device is configured of a memory array which has a plurality of memory words each comprised of a plurality of memory cell groups and one word selector, and in which the memory words adjacent in a row direction are respectively reversibly disposed with a column direction as an axis, the memory words adjacent in the column direction are respectively reversibly disposed with the row direction as an axis, and the memory words are arranged in a matrix form; an address counter which holds an address for selecting a specific word in the memory array; a row decoder connected to the address counter and capable of performing functional switching to one-row selection, even row batch selection, odd row batch selection, and all row batch selection modes; a column decoder connected to the address counter and capable of performing functional switching to one-column selection, even column batch selection, odd column batch selection, and all column batch selection modes; and a control circuit which controls the functional switching of the column decoder and the row decoder.

According to the semiconductor memory device of the present invention, since there is no need to provide a data holding circuit and a voltage converting circuit which greatly affect a chip area, it is possible to write a checkerboard pattern for interference and investigation by three writings regardless of the magnitude of memory capacity in a simple circuit configuration.

DETAILED DESCRIPTION OF THE PREFERRED EMBODIMENTS

A preferred embodiment of the present invention will hereinafter be described with reference to the accompanying drawings.

Figure 1:
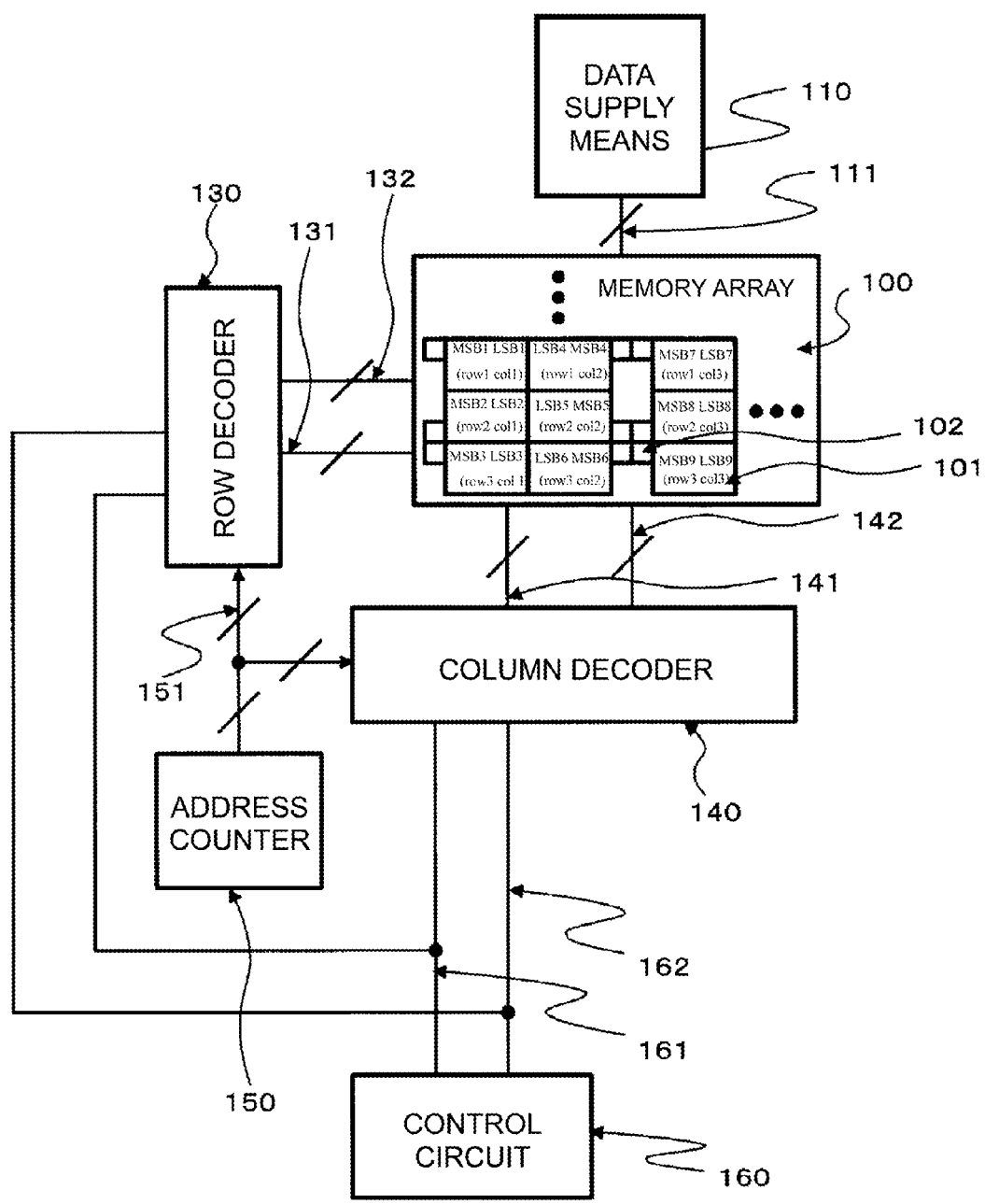
FIG. 1 is a block diagram illustrating a semiconductor memory device of the present invention.

FIG. 1 is a block diagram illustrating a semiconductor memory device according to the present invention.

A configuration of the semiconductor memory device will first be described. The semiconductor memory device is equipped with a memory array 100, a data supply means 110, a row decoder 130, a column decoder 140, an address counter 150, a control circuit 160, a bit line bus 111, an even-numbered row selection signal bus 131, an odd-numbered row selection signal bus 132, an even-numbered column selection signal bus 141, an odd-numbered column selection signal bus 142, an address bus 151, a column/row even-odd selection signal line 161, and a memory array all selection signal line 162.

The memory array 100 is configured by arranging memory words each comprised of a word selector 102 and a memory word group 101 in a matrix form. The data supply means 110 holds a data word to be written equivalent to one word and converts data to be written into a writing voltage. The address counter 150 holds address data therein. The control circuit 160 controls both row and column decoders.

The bit line bus 111 is comprised of a bit line equivalent to one word and connects the memory array 100 and the data supply means 110. The even-numbered row selection signal bus 131 is a collection of signal lines for selecting even rows, of signal buses for connecting the memory array 100 and the row decoder 130 and selecting rows in the memory array 100. The odd-numbered row selection signal bus 132 is a collection of signal lines for selecting odd rows, of signal buses for connecting the memory array 100 and the row decoder 130 and selecting rows in the memory array 100. The even-numbered column selection signal bus 141 is a collection of signal lines for selecting even columns, of signal buses for connecting the memory array 100 and the column decoder 140 and selecting columns in the memory array 100. The odd-numbered column selection signal bus 142 is a collection of signal lines for selecting odd columns, of signal buses for connecting the memory array 100 and the column decoder 140 and selecting columns in the memory array 100. The address bus 151 connects the address counter 150, the row decoder 130, and the column decoder 140. The column/row even-odd selection signal line 161 connects the control circuit 160, the row decoder 130, and the column decoder 140. The memory array all selection signal line 162 connects the control circuit 160, the row decoder 130, and the column decoder 140.

Figure 2:
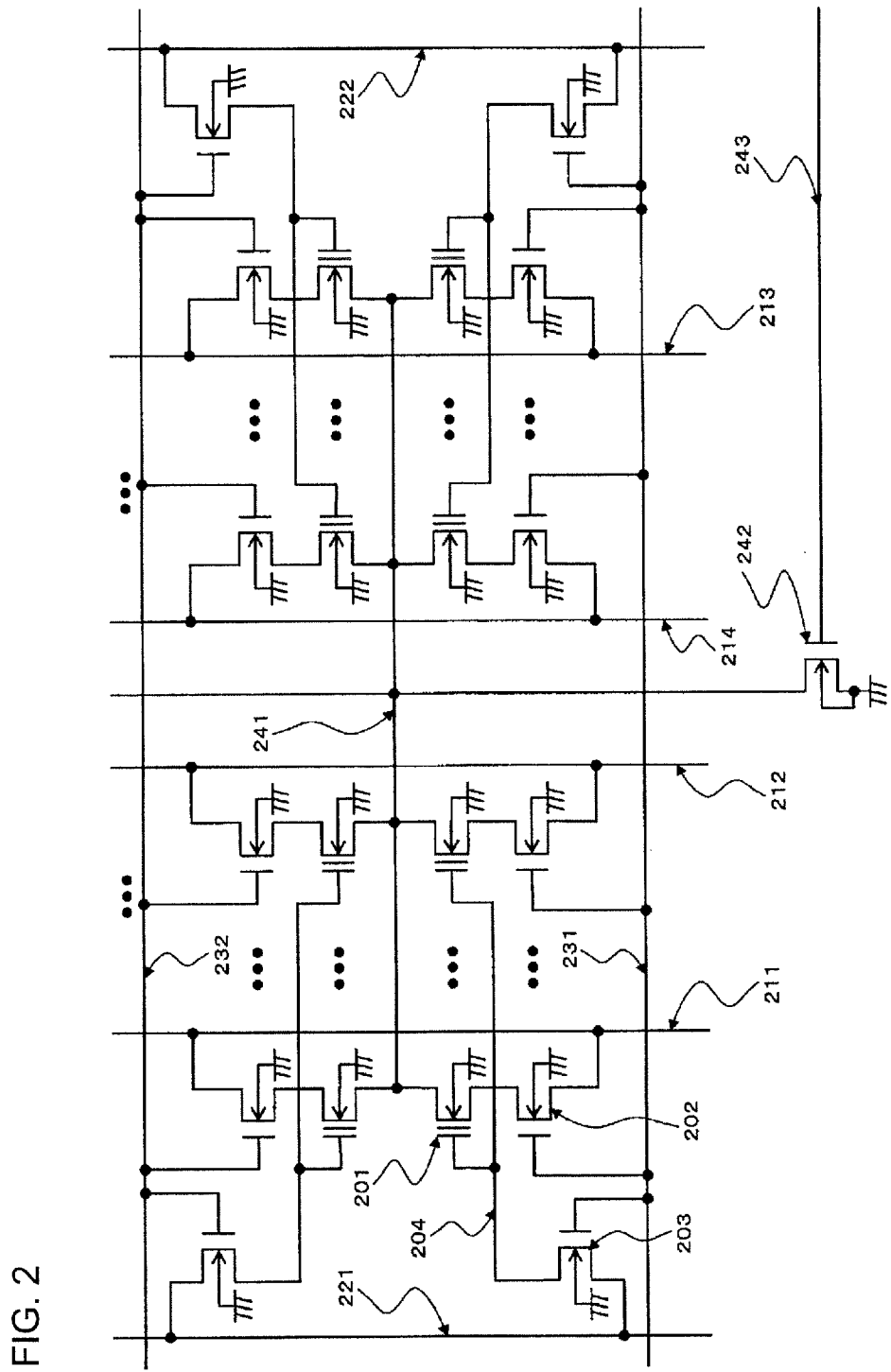
FIG. 2 is a circuit diagram illustrating an arrangement of a recent memory array to be an adaptive object of the present invention.

In the arrangement of the respective memory words in the memory array 100, the memory words adjacent to each other in a row direction are respectively inverted with a column direction as an axis, and the memory words adjacent to each other in the column direction are respectively inverted with the row direction as an axis. The wire sharing of source lines is performed as illustrated in FIG. 2. In the present embodiment, bit lines connected to all data words in the memory array 100 are common for every corresponding bit. If the MSB of the data word is taken for example, a common MSB bit line is connected to the MSBs of all the data words.

The operation of the semiconductor memory device will next be described. Normal data writing will be described by taking, for example, a case where data writing is performed on an arbitrary (N row, M column) memory word.

The control circuit 160 negates the memory array all selection signal line 162 and the column/row even-odd selection signal line 161 to switch the row decoder 130 and the column decoder 140 to a single address selection mode. In the single address selection mode, the row decoder 130 and the column decoder 140 respectively assert a single row selection signal line and a column selection signal line indicated by address data transmitted from the address bus 151. Next, data for designating (N row, M column) in the memory array 100 is stored in the address counter 150. The address data stored therein is supplied to the row decoder 130 and the column decoder 140 through the address bus 151. The row decoder 130 asserts a row selection signal line indicative of the N row out of the even-numbered row selection signal bus 131 and the odd-numbered row selection signal bus 132 to bring all word selectors 102 and all memory cells arranged in the Nth row into a selected state. The column decoder 140 asserts a column selection signal line indicative of the M column out of the even-numbered column selection signal bus 141 and the odd-numbered column selection signal bus 142 and thereby supplies a writing voltage to all word selectors 102 arranged in the Mth column. Each word selector 102 in the memory array 100 supplies a writing voltage from a column address selection signal to the memory cell through an in-address bit selection signal line when it is only in the selected state. As a result, the memory word in which both row address and column address selection signals are brought into an asserted state exits by one word within the memory array 100. The data converted to the writing voltage is supplied via the bit line bus 111 from the data supply means 110 to the memory cell equivalent to one word supplied with the writing voltage, so that the data writing is performed.

A description will next be made of a case where a checkerboard pattern is written into the memory array 100.

The memory array all selection signal line 162 is asserted by the control circuit 160 to switch the row decoder 130 and the column decoder 140 to an all selection mode. In the all selection mode, all row address selection signals and all column address selection signals are asserted regardless of address data. The data supply means 110 stores therein patterns in which data of adjacent memory cells are inverted within the memory word, e.g., data (10101010) or data (01010101) where one word is comprised of 8 bits. When memory writing is carried out in this state, the same data as data stored in data latches are written into all memory words in the memory array 100.

Next, the memory array all selection signal line 162 is negated and the column/row even-odd selection signal line 161 is asserted to switch the row decoder 130 and the column decoder 140 to an even-odd selection mode. In the even-odd selection mode, the row decoder 130 asserts either the even-numbered row selection signal bus 131 or the odd-numbered row selection signal bus 132 on the basis of the address data from the address bus 151. The column decoder 140 asserts either the even-numbered column selection signal bus 141 or the odd-numbered column selection signal bus 142 on the basis of the address data from the address bus 151.

Next, the address counter 150 stores therein data for designating (N row, M column) in the memory array 100. The stored address data is supplied to the row decoder 130 and the column decoder 140 through the address bus 151. The row decoder 130 asserts a row selection signal for selecting the N row, and all row selection signals of numbers equal in even/odd form on the basis of the address data. The column decoder 140 asserts a column selection signal for selecting the M column, and all column selection signals of numbers equal in even/odd form on the basis of the address data. As a result, the memory words equivalent to a quarter in the memory array 100, which include the memory words of (N row, M column), are put in a selected state.

Inverted patterns are stored in the data supply means 110 in terms of the time of all writing. For example, when data (10101010) is stored upon all writing where one word is constituted of 8 bits, data (01010101) is stored in the data supply means 110. When memory writing is done in this state, patterns in which data of adjacent bits are inverted are written into the quarter in the memory array 100, which includes the memory words of (N row, M column).

Next, data for designating (N+1 row, M+1 column) in the memory array 100 is stored in the address counter 150. The stored address data is supplied to the row decoder 130 and the column decoder 140 through the address bus 151. When the row decoder 130 and the column decoder 140 execute data writing, the same data as (N row, M column) is written into the quarter in the memory array 100, which includes memory words of (N+1 row, M+1 column). As a result, the checkerboard pattern is written into the memory array 100. That is, if a writing time and a data transmission time are allowed three times, the checkerboard pattern can be written regardless of memory capacity.

In the semiconductor memory device of the present embodiment, as described above, the writing of the checkerboard pattern has been realized by carrying out the one-quarter writing twice after one all writing. However, row addresses and column addresses respectively different in the first quarter writing and the second quarter writing may be designated, and the order of addresses designated upon the quarter writing does not matter. For example, when the address designated upon the first quarter writing is assumed to be (N row, M+1 column), (N+1 row, M column) is designated upon the second quarter writing. Further, in order to uniform the writing frequency to all memory cells, the same data is written into (N row, M column) and (N+1 row, M column) by the quarter writing, and data bit-inverted from the previously written data is written into (N row, M+1 column) and (N+1 row, M+1 column) by the quarter writing, thereby making it possible to realize the writing of the checkerboard pattern by the four writings in total. This method has an advantage that although the writing time is increased once, the number of writings can be made uniform within the memory array 100. Further, the number of bits which configure the memory words can be configured in arbitrary numbers regardless of even and odd numbers.

APPENDIX

[FIG. 1]
- 100 memory array
- 101 memory cell group
- 102 word selector
- 110 data supply means
- 111 bit line bus
- 130 row decoder
- 131 row selection signal bus (for even-number selection)
- 132 row selection signal bus (for odd-number selection)
- 140 column decoder
- 141 column selection signal bus (for even-number selection)
- 142 column selection signal bus (for odd-number selection)
- 150 address counter
- 151 address signal bus
- 160 control circuit
- 161 column/row even-odd selection signal line
- 162 memory array all selection signal line

[FIG. 2]
- 201 floating gate
- 202 control gate
- 203 word selector
- 204 gate voltage supply line
- 211 bit line for MSB data at column N
- 212 bit line for LSB data at column N
- 213 bit line for MSB data at column N+1
- 214 bit line for LSB data at column N+1
- 221 column N select signal
- 222 column N+1 select signal
- 231 row N select signal
- 232 row N+1 select signal
- 241 voltage source line
- 242 voltage source line control gate
- 243 voltage source line control signal

Figure 3:
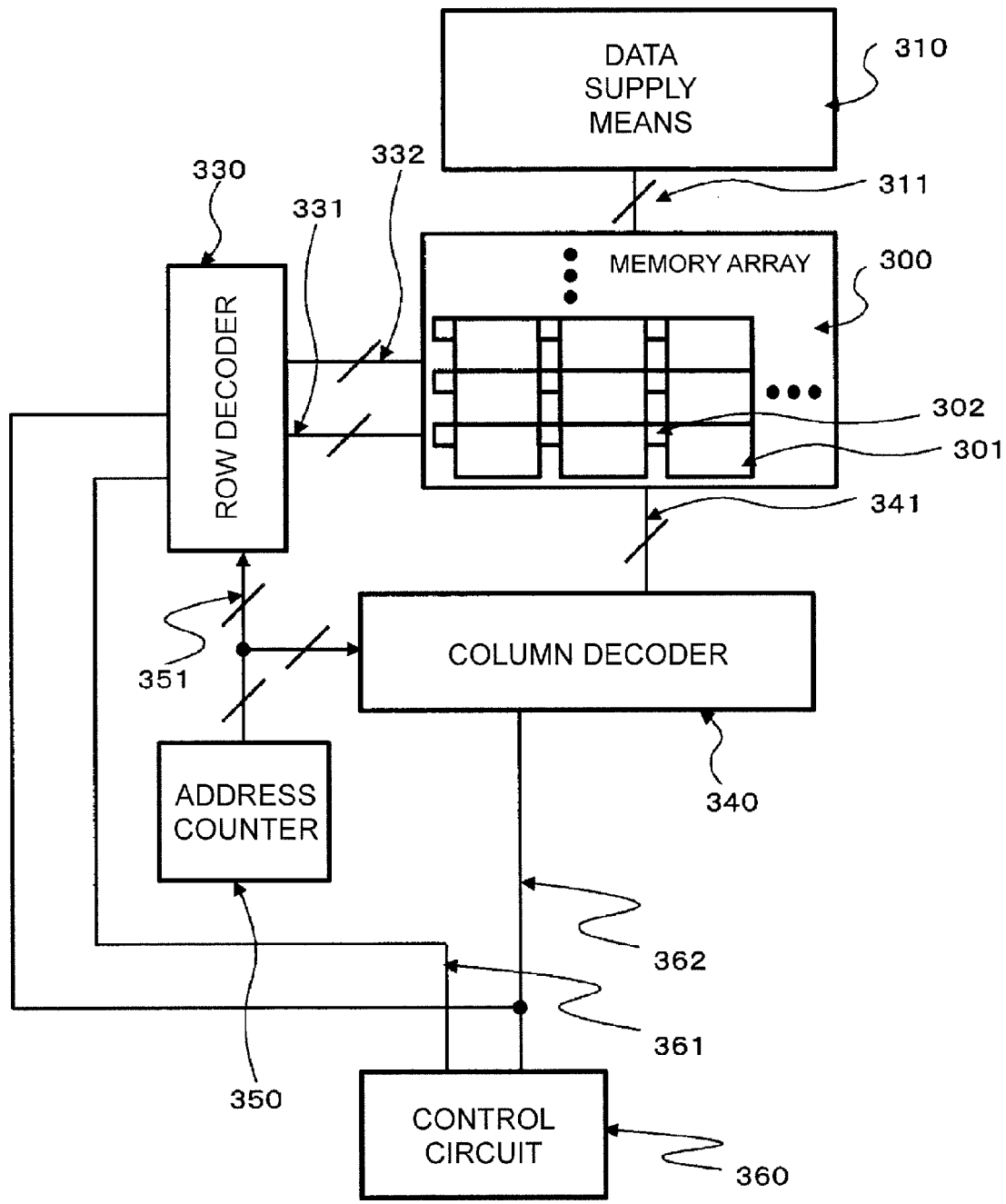
FIG. 3 is a block diagram illustrating a related art semiconductor memory device.

[FIG. 3]
- 300 MEMORY ARRAY
- 301 memory cell group
- 302 word selector
- 310 DATA SUPPLY MEANS
- 311 bit line bus
- 330 ROW DECODER
- 331 row selection signal bus
- 332 row selection signal bus
- 340 COLUMN DECODER
- 341 column selection signal bus
- 350 ADDRESS COUNTER
- 351 address signal bus
- 360 CONTROL CIRCUIT
- 361 row selection signal line
- 362 column selection signal line

Figure 4:
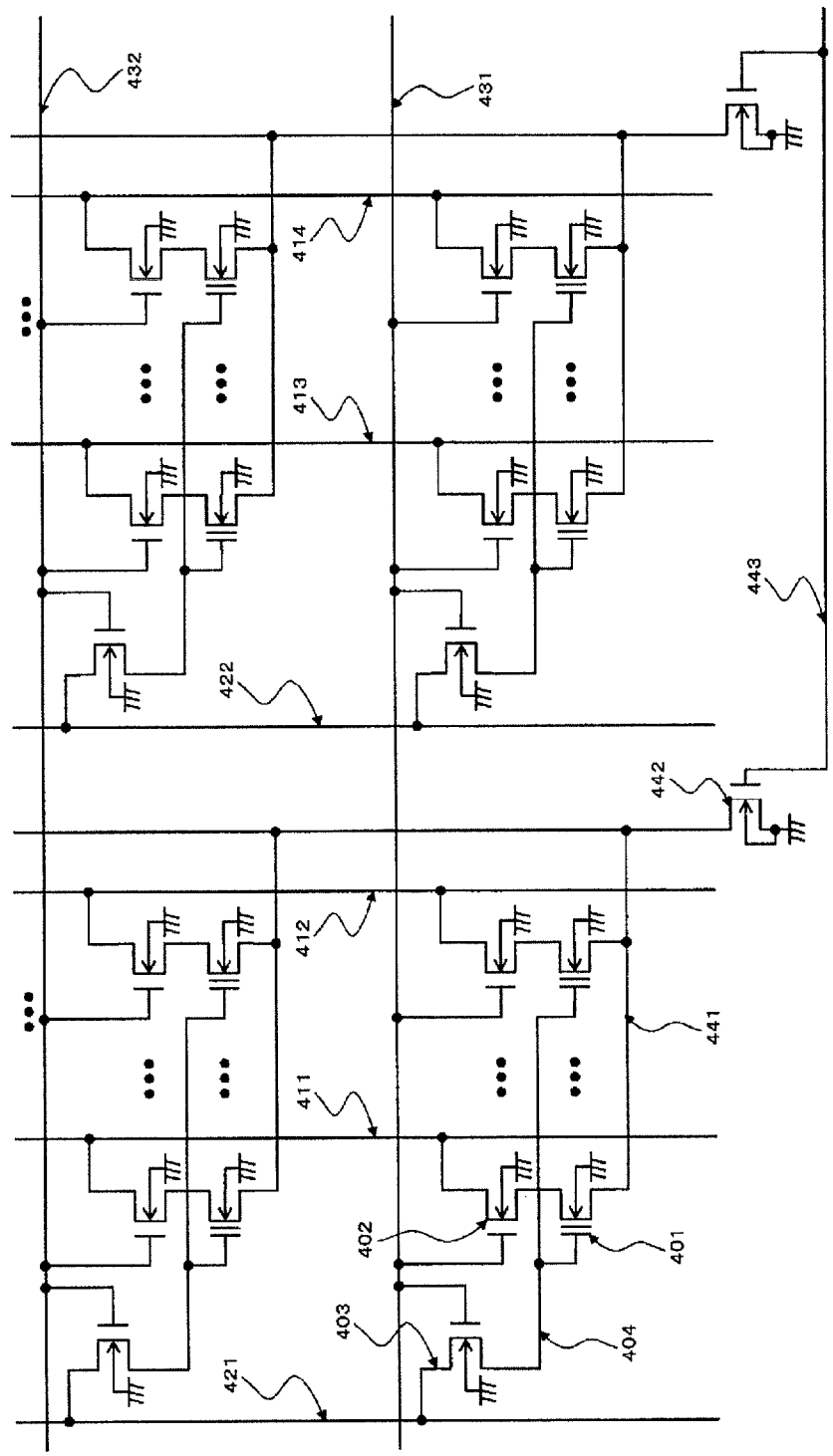
FIG. 4 is a circuit diagram illustrating an arrangement of a related art memory array.

[FIG. 4]
- 401 floating gate
- 402 control gate
- 403 word selector
- 404 gate voltage supply line
- 411 bit line for MSB data at column N
- 412 bit line for LSB data at column N
- 413 bit line for MSB data at column N+1
- 414 bit line for LSB data at column N+1
- 421 column N select signal
- 422 column N+1 select signal
- 431 row N select signal
- 432 row N+1 select signal
- 441 voltage source line
- 442 voltage source line control gate
- 443 voltage source line control signal

What is claimed is:

1. A semiconductor memory device comprising:
   a memory array which has a plurality of memory words each comprised of a plurality of memory cell groups and one word selector and in which the memory words pairs adjacent in a row direction are respectively to be first reversedly disposed with a column direction as an axis, the memory words pairs adjacent in the column direction are respectively to be second reversedly disposed with the row direction as an axis, and the memory words pairs are arranged in a matrix form;
   a data supply means which is connected to the memory array and supplies writing data corresponding to one word;
   an address counter which holds an address for selecting a specific word in the memory array;
   a row decoder connected to the address counter and capable of performing a functional switching to one-row selection, even row batch selection, odd row batch selection, and all row batch selection modes;
   a column decoder connected to the address counter and capable of performing the functional switching to one-column selection, even column batch selection, odd column batch selection, and all column batch selection modes; and a control circuit which controls the functional switching of the column decoder and the row decoder.

2. A data writing method comprising the steps of in the semiconductor memory device according to claim 1:

selecting all row batch selection and all column batch selection modes and writing data of patterns in each of which data of memory cells adjacent in each memory word pairs are inverted, into all memory words;

subsequently selecting an even or odd row batch selection mode and an even or odd column batch selection mode and writing data of a pattern reverse to each of the patterns subjected to the inversion into a selected memory word; and further selecting an odd or even row batch selection mode and an odd or even column batch selection mode both unselected in the even or odd row batch selection mode and the even or odd column batch selection mode, and writing data of a same pattern as a pattern in reverse to the pattern subjected to the inversion into a selected memory word.

\* \* \* \* \*